United States Patent [19]

Kubo et al.

[11] Patent Number: 4,861,941
[45] Date of Patent: Aug. 29, 1989

[54] SHIELDING DEVICE

[75] Inventors: Kazuhiko Kubo, Mishima; Susumu Saitou, Ibaraki; Akira Usui, Takatsuki; Hiroyuki Nagai, Ibaraki, all of Japan

[73] Assignee: Matsushita Electric Industrial Co., Inc., Osaka, Japan

[21] Appl. No.: 184,490
[22] PCT Filed: Jun. 18, 1987
[86] PCT No.: PCT/JP87/00396
 § 371 Date: Feb. 11, 1988
 § 102(e) Date: Feb. 11, 1988
[87] PCT Pub. No.: WO87/07998
 PCT Pub. Date: Dec. 30, 1987

[30] Foreign Application Priority Data

Jun. 20, 1986 [JP] Japan ............... 61-145239

[51] Int. Cl.4 .......... H05K 9/00; H05K 1/00; H05K 3/00
[52] U.S. Cl. .................... 174/35 R; 29/829; 29/852
[58] Field of Search ........... 174/35 R; 361/424; 29/829, 846, 852

[56] References Cited

U.S. PATENT DOCUMENTS

| 4,626,963 | 12/1986 | Speer | 174/35 R X |
| 4,642,735 | 2/1987 | Hodsdon et al. | 174/35 R X |
| 4,649,461 | 3/1987 | Matsuta | 174/35 R X |
| 4,739,453 | 4/1988 | Kurokawa | 361/424 |

FOREIGN PATENT DOCUMENTS

| 7810941 | 12/1978 | Fed. Rep. of Germany . | |
| 3790315 | 1/1989 | Fed. Rep. of Germany . | |
| 108502 | 8/1979 | Japan | 174/35 R |
| 59-9591 | 1/1984 | Japan . | |
| 59-9592 | 1/1984 | Japan . | |
| 59-182975 | 12/1984 | Japan . | |
| 60-154600 | 8/1985 | Japan . | |

Primary Examiner—Morris H. Nimmo
Attorney, Agent, or Firm—Stevens, Davis, Miller & Mosher

[57] ABSTRACT

The present invention is directed to a shielding device of a double-sided printed substrate used in a circuit for processing a high frequency signal such as a television tuner circuit and the like, which is arranged such that a first grounding conductor film (12a) is formed on one side of the substrate (11), a second grounding conductor film (12b) is formed on the other side of the substrate (11), both the conductor films (12a, 12b) are connected by a through-hole conductor (15b), an opening portion of a through hole (15a) at at least one side is covered and closed by a solder resist (16), and the shielding plate (13) is mounted on the conductor film (12a) on the one side and both members are soldered. In particular, when a ceramic substrate is used as the substrate (11), it is arranged so as to obtain reliable soldering and satisfactory shielding effects while ensuring the strength thereof.

8 Claims, 5 Drawing Sheets

1

SHIELDING DEVICE

TECHNICAL FIELD

The present invention relates to a shielding device on a double-sided printed substrate on which a circuit for processing a high frequency signal such as a television tuner circuit, a receiver for a satellite broadcast, or the like is formed.

BACKGROUND ART

Recently, advances in packaging techniques have led to a substrate for mounting electronic components using ceramics rather than a substrate made from a member of the resin families. Generally, when a high frequency circuit including a UHF tuner, or the like is formed on a printed substrate, a shielding plate is erected (partition plate) to prevent interference and disturbance between individual circuit blocks. In this case, in the prior art, a plurality of legs are formed integrally with the shielding plate, and on the other hand, holes are formed in the printed substrate. The legs are inserted into the holes and soldered to a grounding conductor film on the back side of the printed substrate.

This technique will be described in detail with reference to FIGS. 1A and 1B. In FIGS. 1A and 1B, numeral 1 designates a substrate, 2 a grounding conductor film formed on the back side of the substrate 1, 3 a shielding plate, and 4 designates solder for connecting legs 3a of the shielding plate 3 to the grounding conductor film 2. Further, FIG. 1A is a cross section as viewed from the front side of the shielding plate, and FIG. 1B is a cross section as viewed from the side thereof.

Here, the substrate 1 is provided with rectangular holes for inserting therein the legs 3a of the shielding plate 3, and as shown in FIGS. 1A and 1B, the grounding conductor film 2 and the legs 3a are soldered to each other by passing the substrate 1 through a solder dipping vessel in a condition in which the legs 3a are inserted into the substrate 1.

However, in the arrangement mentioned above, it is necessary to form a multiplicity of rectangular holes in the substrate 1 for shielding therein the legs 3a of the shielding plate 3, and in particular, when a ceramic substrate is used as the substrate 1, a crack is apt to be caused in the substrate 1 from a portion of the corner of the rectangular hole due to a mechanical shock or a heat shock at the time of solder dipping. For example, as the rectangular hole, a hole of 1.5 mm+6 mm may be bored.

SUMMARY OF THE INVENTION

An object of the present invention is to provide a shielding device which achieves a satisfactory shielding effect without damaging the substrate.

Another object of the present invention is to provide a shielding device in which the soldering of a shielding plate to a grounding conductor film can be performed much more reliably.

In a shielding device of the present invention, conductor films for grounding are formed respectively on one side and on the other side of a substrate, a penetrating hole (hereinafter referred to as a through-hole) is formed in the substrate, the conductor film on the one side is connected to the conductor film on the other side by a through-hole conductor disposed in this through-hole, no leg is provided on the shielding plate, a shielding plate is placed on the conductor film on the one side or on the other side, and the shielding plate is soldered to the conductor film on the one side or the other side. In this case, an opening portion of the through-hole is covered by a solder resist to prevent the solder from flowing out towards the other side passing through the through-hole, thereby to achieve reliable soldering to the conductor film on the one side or the other side of the shielding plate.

BRIEF DESCRIPTION OF THE DRAWINGS

FIGS. 2A and 1B are respectively a plan view, and a sectional view taken along the line 2B—2B, of a shielding device in one embodiment of the present invention.

BEST MODE FOR CARRYING OUT THE INVENTION

Figure 1A:
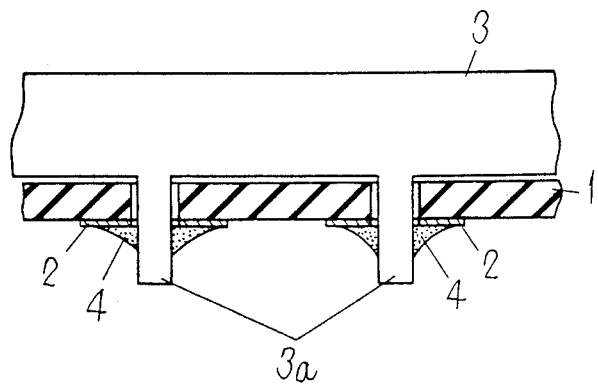
FIGS. 1A and 1B are respectively a front sectional view and a side sectional view of a principal part of a prior art shielding device.
Figure 1B:
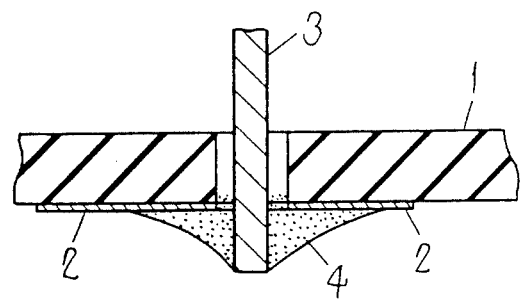
Figure 2A:
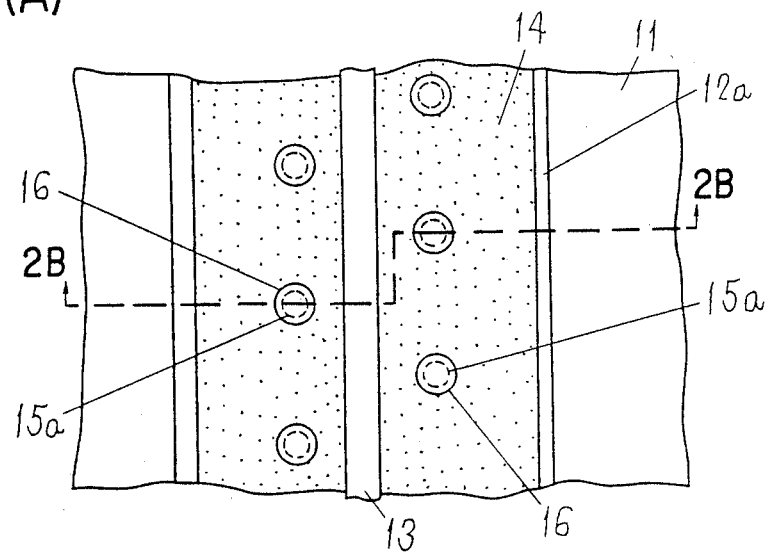
Figure 2B:
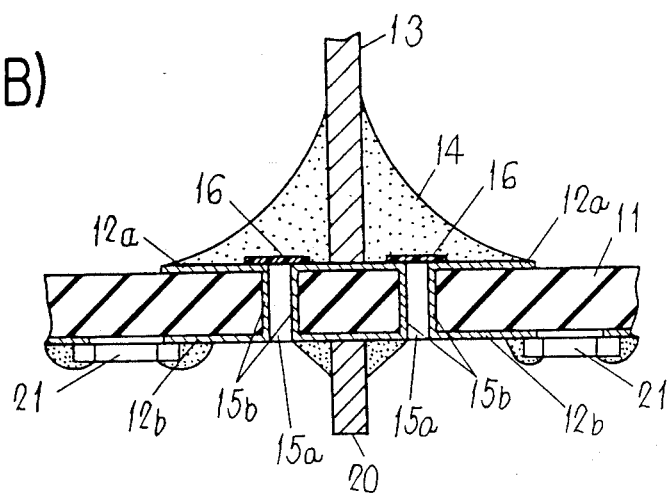

Hereinafter, an embodiment of a shielding device of the present invention will be described with reference to the attached drawings. FIGS. 2A and 2B, and FIGS. 3A and 3B show a first embodiment of the present invention. In these Figures, numeral 11 designates a substrate for a hybrid IC, for example, a ceramic substrate, and 12a designates a grounding conductor film formed on one side of the substrate 11, and it is formed on a position at which a shielding plate 13 is to be mounted. Numeral 12b designates a grounding conductor film formed on the other side of the substrate 11. It is not formed on the shielding plate 13 (partition). Numeral 15a designates through holes formed in the substrate 11 penetrating therethrough, and they are holes of a rounded and substantially circular shape. Numeral 15b designates through-hole conductors formed on the inner walls of the through-holes 15a to connect the grounding conductor film 12a on the other side to the grounding conductor film 12b on the other side. Numeral 16 designates solder resists formed on the grounding conductor film 12a on one side so as to close opening portions of the through holes 15a. The solder resists 16 can be formed by printing by using a roller, and they are formed in order to prevent creamy solder from flowing out to the other side passing through the through-holes 15a at the time of dip soldering or reflow soldering.

Figure 3A:
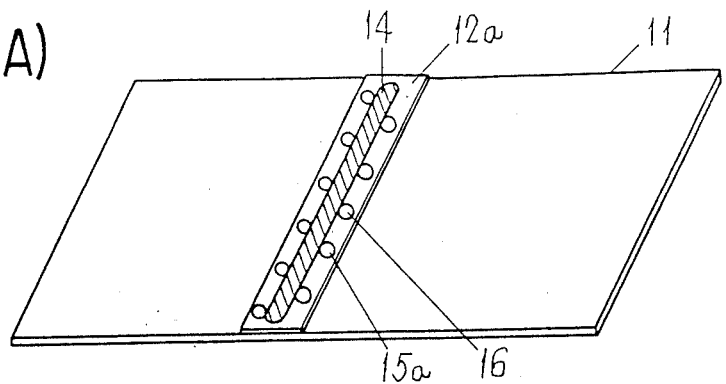
FIGS. 3A and 3B are respectively a perspective view before soldering and a perspective view after soldering of a shielding plate of the shielding device.
Figure 3B:
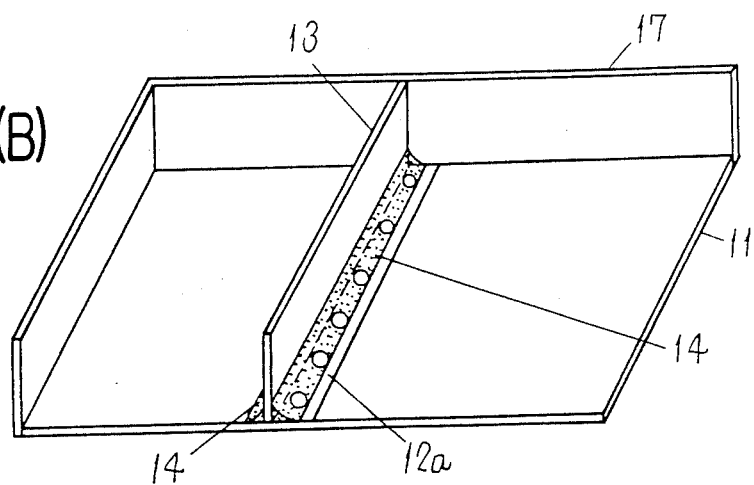

Next, a process of soldering the above-mentioned shielding plate 13 to the grounding conductor films 12a and 12b will be described. As shown in FIG. 3A, firstly, creamy solder 14 is coated on the grounding conductor film 12a on one side. Thereafter, the shielding plate 13 is positioned on the creamy solder 14. In this condition, the substrate 11 is passed through a molten solder dipping vessel at a high temperature to bring the substrate 11 in contact with a surface of the molten solder to apply heat of the molten solder to the creamy solder 14 through the substrate 11, or the substrate 11 is passed through a reflow furance (heating furnace) to heat and melt the creamy solder 14. Hence, it is possible to solder the shielding plate 13 to the grounding conductor films 12a and 12b.

In this case, by forming a multiplicity of through-holes 15 at right and left sides with respect to the shielding plate 13 along the lengthwise direction thereof so that the positions of the through-holes 15 are shifted alternately from each other, an electrical effect similar to the prior art in which the legs are directly connected to the grounding conductor film on the back side of the substrate, that is, a sufficient shielding effect can be obtained while ensuring the strength of the substrate 11. For example, it may be considered that the positions of the through-holes at the right and left sides with respect to the shielding plate 13 are made entirely identical, however, in particular, the intervals of the right and left through-holes become small, and the fear of causing a crack or the like in the substrate increases. As described above, by shifting the right and left positions of the through-holes 15a from each other, the intervals between the through-holes 15a become large and the strength of the substrate 11 can be ensured. Furthermore, by connecting the grounding conductor film 12a on one side to the grounding conductor film 12b on the other side by means of the multiplicity of through-holes 15a, a high frequency impedance therebetween can be decreased, and a high shielding effect can be obtained.

Figure 4:
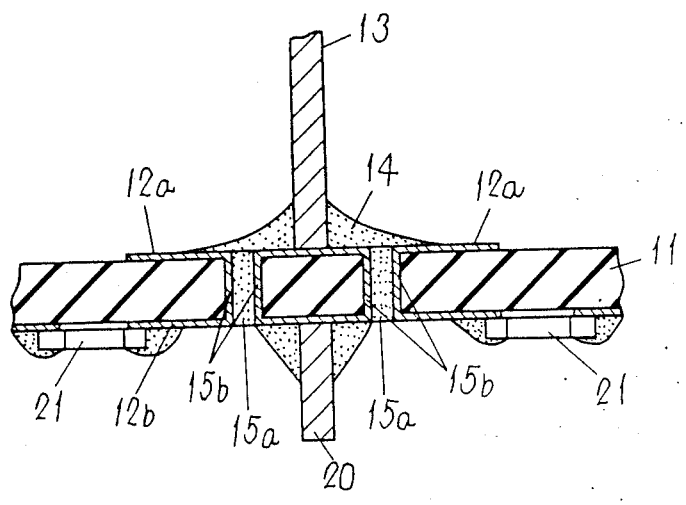
FIG. 4 is a sectional view showing a soldering condition in which solder resist is not used.
Figure 5A:
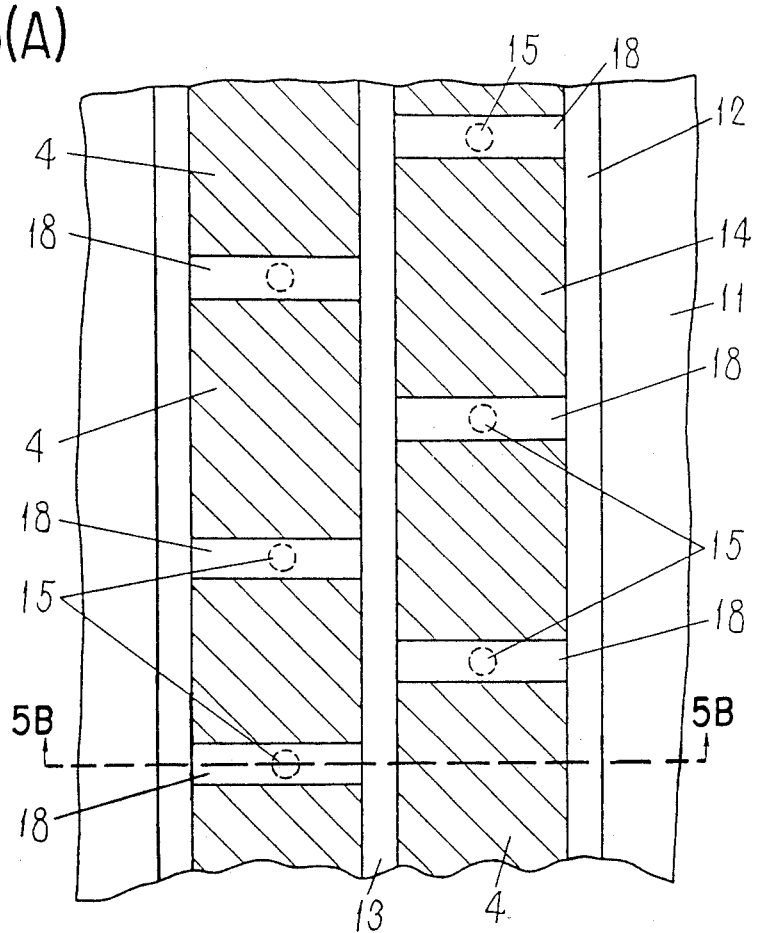
FIGS. 5A and 5B are respectively a plan view, and a sectional view taken along the line 5B—5B showing a shielding device of another embodiment of the present invention.
Figure 5B:
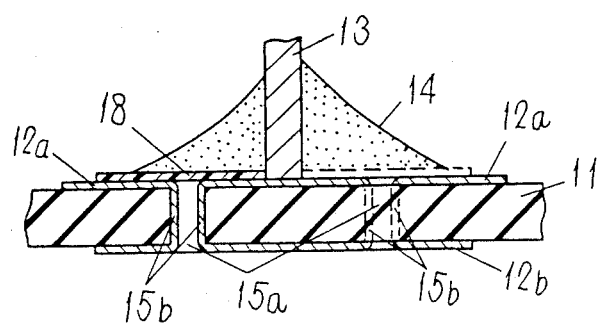

Moreover, it is possible to solder the shielding plate 13 to the grounding conductor film 12a securely. For example, such a case as shown in FIG. 4 will be considered in which no solder resist 16 is formed on through-holes 15a. In this case, in particular, when the soldering is carried out by passing a shielding plate 13 through a solder dipping vessel, during the dip soldering, since creamy solder 14 is sucked towards the back side of a substrate 11 through the through-holes 15a, the amount of solder on the front side, that is, on the grounding conductor film 12a on which the shielding plate 13 is mounted directly is decreased extremely and the soldering of the shielding plate 13 to the grounding conductor film 12a becomes difficult. As a result, a problem occurs in that the high frequency impedance becomes high, and the shielding effect is degraded.

However, as shown in FIGS. 2 and 3, by closing the opening portions of the through-holes 15a on the grounding conductor film 12a by coating the solder resists 16 thereon, the escape of the creamy solder is prevented, and the reliable soldering can be achieved between the shielding plate 13 and the grounding conductor film 12a throughout the whole length of the shielding plate 13. Thus, the high frequency impedance is decreased and a satisfactory shielding effect is obtained. Furthermore, since it is not required to bore a large hole of a rectangular shape in the substrate 11, there is no fear of causing a crack in the substrate.

In this respect, the through-holes 15a are formed to have a diameter (inner diameter) of 0.4 mm, and the solder resists 16 can be formed to have a diameter of 0.6 to 0.8 mm. Furthermore, the through-holes 15a can be formed at intervals of 2 mm.

In addition in FIGS. 2 and 4, numerals 20 and 21 designate respectively a shielding plate and a chip component, and they are soldered by dip soldering simultaneously with or prior to the soldering of the shielding plate 13.

In FIGS. 5A and 5B, and FIGS. 6A and 6B, other embodiments of the present invention are shown. In these Figures, as in the first embodiment grounding conductor films 12a and 12b are formed on a portion of one side of a substrate 11 at which a shielding plate 13 is erected and on the other side thereof, and in which the grounding conductor films 12a and 12b on the one side and on the other side are connected by through-hole conductors 15b.

In FIGS. 5A and 5B and 6A and 6B, on the grounding conductor film 12a on the one side to the right and left of the shielding plate 13 which is disposed on the grounding conductor film 12a, solder resists 18 are formed in a zig-zag shape so as to divide the grounding conductor film 12a into a plurality of sections with respect to the shielding plate 13. This point differs from the first embodiment.

Figure 6A:
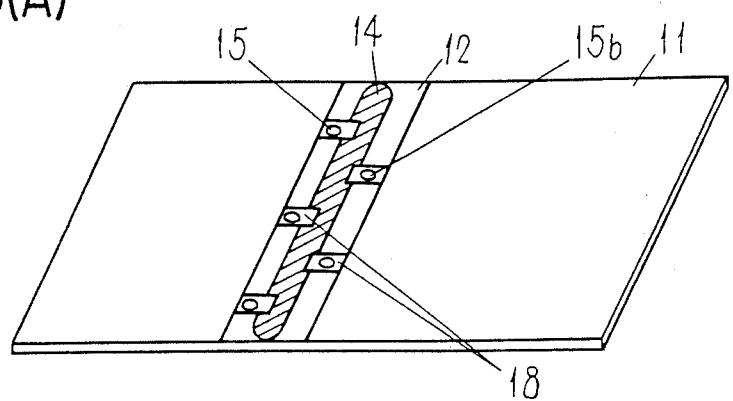
FIGS. 6A and 6B are respectively a perspective view before soldering and a perspective view after soldering of the shielding plate of the shielding device.
Figure 6B:
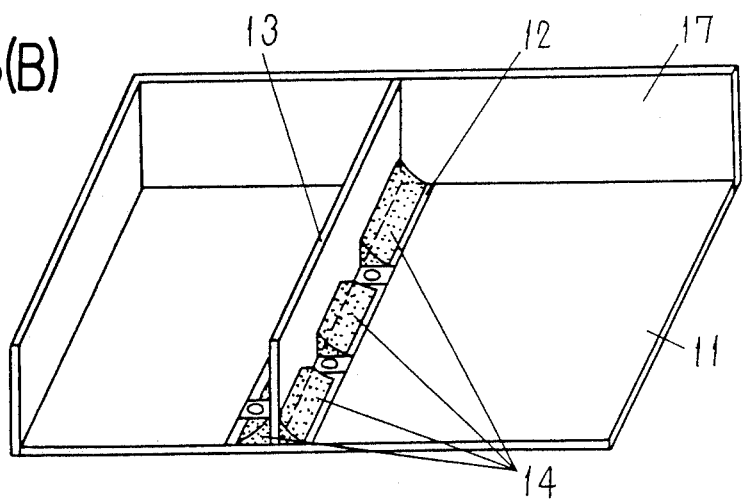

By forming the solder resists 18 in this manner, molten solder 14 is not formed unevenly during reflowing or solder-dipping, and a sufficient amount of solder adheres to each of a plurality of divided grounding conductor films 12a as shown in FIG. 6B and secure soldering can be formed throughout the whole length of the shielding plate 13. Here, the through-holes 15a are formed beneath each of the solder resists 18. Further, in FIGS. 3 and 6, numeral 17 designates a shielding case body. Moreover, in the examples shown in the Figures, for ease of understanding, the shielding plate is represented by only one sheet. However, actually, a plurality of sheets are mounted for each X and Y directions, and they are soldered by a similar means to the grounding conductor films 12a of the substrate 11.

INDUSTRIAL APPLICABILITY

As described in the foregoing, in accordance with the present invention, grounding conductor films on one side and on the other side of a substrate are coupled to each other by through-hole conductors, a shielding plate is soldered on the grounding conductor film on the one side, and solder resists are applied to close openings of the through-holes. As a result, the solder on one side is not sucked to the other side passing through the through-holes, and satisfactory soldering, that is, a reliable shielding effect can be obtained. Furthermore, since it is only necessary to form through-holes of substantially circular shape in the substrate, and there is no need to form square holes of a rectangular shape, there is no fear of cracking due to heat shock or the like. Moreover, a troublesome work such as inserting legs into the substrate is eliminated, and the workability is improved. Hence, the present invention is suitable for forming a high frequency circuit such as a VHF tuner, UHF tuner and the like on a double-sided printed substrate.

We claim:

1. A shielding device wherein a shielding plate is erected on one side of a substrate and is connected to a grounding conductor film on the other side of said substrate, comprising:

grounding conductor films respectively formed on said one side and on said other side of said substrate, said conductor film on said one side being connected to said conductor film on said other side by at least one through-hole conductor applied to at least one through-hole in said substrate, an opening portion of said at least one through-hole on at least one side of said substrate being covered and closed by a solder resist, and said shielding plate being mounted on said grounding conductor film on the at least one side and soldered thereto.

2. A shielding device according to claim 1, wherein a multiplicity of through-holes are formed so as to be positioned at right and left sides with respect to said shielding plate and alternately to each other along a lengthwise direction of said shielding plate, each of said through-holes being covered by a respective solder resist.

3. A shielding device according to claim 1, wherein solder resists are formed so as to divide said grounding conductor film on the at least one side into a plurality of sections at right and left sides with respect to said shielding plate and alternately to each other along a lengthwise direction of said shielding plate.

4. A shielding device as in claim 1 wherein said substrate is formed of a ceramic material.

5. A method of forming a shielding device comprising the steps of:
  forming grounding conductor films respectively on opposite sides of a substrate;
  electrically interconnecting the respective grounding conductor films through at least one through-hole formed in said substrate;
  covering an open portion of said through-hole on at least one side of said substrate with a solder resist;
  coating the grounding conductor film on said one side of said substrate with a creamy solder;
  mounting a shielding plate on said grounding conductor film on said one side of said substrate through said creamy solder; and
  soldering said shielding plate to said conductor film on said one side of said substrate.

6. A method according to claim 5, wherein said shielding plate is soldered to said grounding conductor film on said one side of said substrate by solder dipping.

7. A method according to claim 5, wherein said shielding plate is soldered to said grounding conductor film on said one side of said substrate by reflow soldering.

8. A method according to claim 5 wherein said substrate is formed of a ceramic material.

* * * * *